United States Patent
Rylov et al.

(10) Patent No.: US 7,107,301 B2
(45) Date of Patent: Sep. 12, 2006

(54) METHOD AND APPARATUS FOR REDUCING LATENCY IN A DIGITAL SIGNAL PROCESSING DEVICE

(75) Inventors: Sergey V. Rylov, White Plains, NY (US); Alexander V. Rylyakov, Mount Kisco, NY (US); José A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 1131 days.

(21) Appl. No.: 10/095,206

(22) Filed: Mar. 11, 2002

(65) Prior Publication Data

US 2003/0169778 A1   Sep. 11, 2003

(51) Int. Cl.
*G06F 17/17* (2006.01)
*G06F 17/10* (2006.01)

(52) U.S. Cl. ........................ 708/313; 708/316; 708/319

(58) Field of Classification Search ................ 708/313, 708/316, 319
See application file for complete search history.

(56) References Cited

U.S. PATENT DOCUMENTS

| | | | | |
|---|---|---|---|---|
| 4,852,035 A | * | 7/1989 | Michener | 708/313 |
| 5,235,647 A | * | 8/1993 | Van de Kerkhof | 704/220 |
| 5,557,632 A | * | 9/1996 | Kaku et al. | 375/340 |
| 6,751,277 B1 | * | 6/2004 | Pesquet-Popescu | 375/350 |

* cited by examiner

*Primary Examiner*—Tan V. Mai
(74) *Attorney, Agent, or Firm*—Ryan, Mason & Lewis LLP

(57) ABSTRACT

A digital signal processing device for processing an input signal includes delay generation circuitry and processing circuitry. The delay generation circuitry receives the input signal and includes a plurality of delay stages operatively coupled together, each of the delay stages having a predetermined time delay associated therewith. The delay generation circuitry includes a zero delay signal path and at least one nonzero delay signal path associated therewith. The processing circuitry is operatively configured to: (i) define a first subset of signal paths through the delay generation circuitry, the first subset including the zero delay signal path, and at least a second subset of signal paths through the delay generation circuitry, the second subset including one or more nonzero delay signal paths; (ii) remove an idle delay from all signal paths in the second subset, such that a shortest nonzero delay signal path in the second subset becomes a zero delay signal path; and (iii) incorporate the idle delay with the processing circuitry.

20 Claims, 6 Drawing Sheets

METHOD AND APPARATUS FOR REDUCING LATENCY IN A DIGITAL SIGNAL PROCESSING DEVICE

FIELD OF THE INVENTION

The present invention relates generally to digital signal processing, and more particularly relates to reducing a latency in a digital signal processing device.

BACKGROUND OF THE INVENTION

Digital filters, being well-suited for digital signal processing (DSP) applications, are being used in an increasing number of electronic systems. One commonly used type of digital filter is a finite impulse response (FIR) filter. The FIR filter is a sampled data filter that is characterized by its impulse response and comprises a number of tap coefficients or weights. Samples of an input signal V(t) are shifted into the FIR filter one sample per cycle. At each cycle t, the FIR filter computes the sum y(t):

$$y(t) = \sum_{i=0}^{n-1} A_i \cdot V(t-i)$$

where, V(t−i) is a t−$i^{th}$ sample of input V(t), $A_i$ is an $i^{th}$ tap coefficient of the FIR filter for $0 \leq i \leq n-1$ and n is the number of tap coefficients of the FIR filter.

Distributed arithmetic FIR filters are known to utilize less logic gates than digital FIR filters employing a transpose-form architecture. However, conventional transpose architecture FIR filters typically have less latency. Consequently, it would be desirable to create an improved distributed arithmetic digital FIR filter having a reduced latency.

SUMMARY OF THE INVENTION

The present invention provides techniques for reducing a latency in a digital signal processing device, such as may be implemented in a distributed arithmetic digital finite impulse response (FIR) filter. By taking advantage of timing dependencies (i.e., redundancies) of certain signal paths within the digital signal processing device, an overall latency of the digital signal processing device may be significantly reduced.

In accordance with one aspect of the invention, a digital signal processing device for processing an input signal presented thereto is provided which includes delay generation circuitry and processing circuitry. The delay generation circuitry receives the input signal and includes a plurality of delay stages operatively coupled together, each of the delay stages having a predetermined time delay associated therewith. The delay generation circuitry includes a zero delay signal path and at least one nonzero delay signal path associated therewith. The processing circuitry is operatively configured to: (i) define a first subset of signal paths through the delay generation circuitry, the first subset including the zero delay signal path, and at least a second subset of signal paths through the delay generation circuitry, the second subset including one or more nonzero delay signal paths; (ii) remove an idle delay from all signal paths in the second subset, such that a shortest nonzero delay signal path in the second subset becomes a zero delay signal path; and (iii) incorporate the idle delay with the processing circuitry.

At least a portion of the idle delay may be incorporated into the processing circuitry by selectively increasing a computational workload in one or more signal paths associated with the second subset and reducing a computational workload in one or more signal paths associated with the first subset, such that a difference between computational latencies associated with the first and second subsets is substantially equal to the idle delay.

In accordance with another aspect of the invention, in a digital signal processing device including delay generation circuitry and processing circuitry, a method for reducing the latency in the digital signal processing device comprises the steps of: (i) identifying a first subset of signal paths through the delay generation circuitry, the first subset of signal paths including a zero delay signal path; (ii) identifying at least a second subset of signal paths through the delay generation circuitry, the second subset of signal paths including one or more nonzero delay signal paths; (iii) operatively removing an idle delay from all signal paths in the second subset, such that a shortest nonzero delay signal path in the second subset becomes a zero delay signal path; and (iv) incorporating the idle delay with the processing circuitry.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention generally provides techniques for reducing latency in a digital signal processing device. The latency reduction techniques of the present invention will be described in conjunction with an exemplary distributed arithmetic (DA) digital finite impulse response (FIR) filter application. It is to be appreciated, however, that the present invention is not limited to this or any particular digital FIR filter application. The invention uniquely exploits a principle that if a signal processing unit includes a delay block having a predetermined delay $t_d$ followed by a processing (i.e., function) block having properties independent of time, then the positions of the delay and function blocks in each of one or more signal paths associated with the signal processing unit can be swapped without affecting the overall output signal. This being the case, the delay block can be folded into or merged with the function block, for example, by equivalently removing the delay block and increasing the latency of the function block by an amount substantially equal to the predetermined delay $t_d$ of the removed delay block.

Advantageously, the methodology of the present invention provides an easier implementation of the function block, at least in terms of design complexity, since the function block is allowed more time to perform its designated function. Moreover, in accordance with another aspect of the invention, in a digital signal processing device comprising multiple function blocks, a computational workload through a subset of the signal paths can be selectively redistributed between the corresponding function blocks in a more efficient manner, the computational workload having a certain latency associated therewith. For instance, a computational workload can be increased in the function blocks having larger amounts of idle delay and reduced in those function blocks having little or no idle delay associated therewith. As a result of such redistribution, one or more critical signal paths through the digital signal processing device is effectively shortened, and therefore the overall latency of the digital signal processing device is reduced.

It is to be appreciated that, in accordance with the present invention, the redistribution of computational workloads through the signal paths associated with the digital signal processing device can be performed in signal paths that may be partitioned into nested subsets (i.e., sub-subsets), wherein, for one or more of the nested subsets associated with a given subset of signal paths, the computational workload may be redistributed in a manner consistent with the computational workload redistribution techniques described above to further reduce latency in the digital signal processing device.

Figure 1:
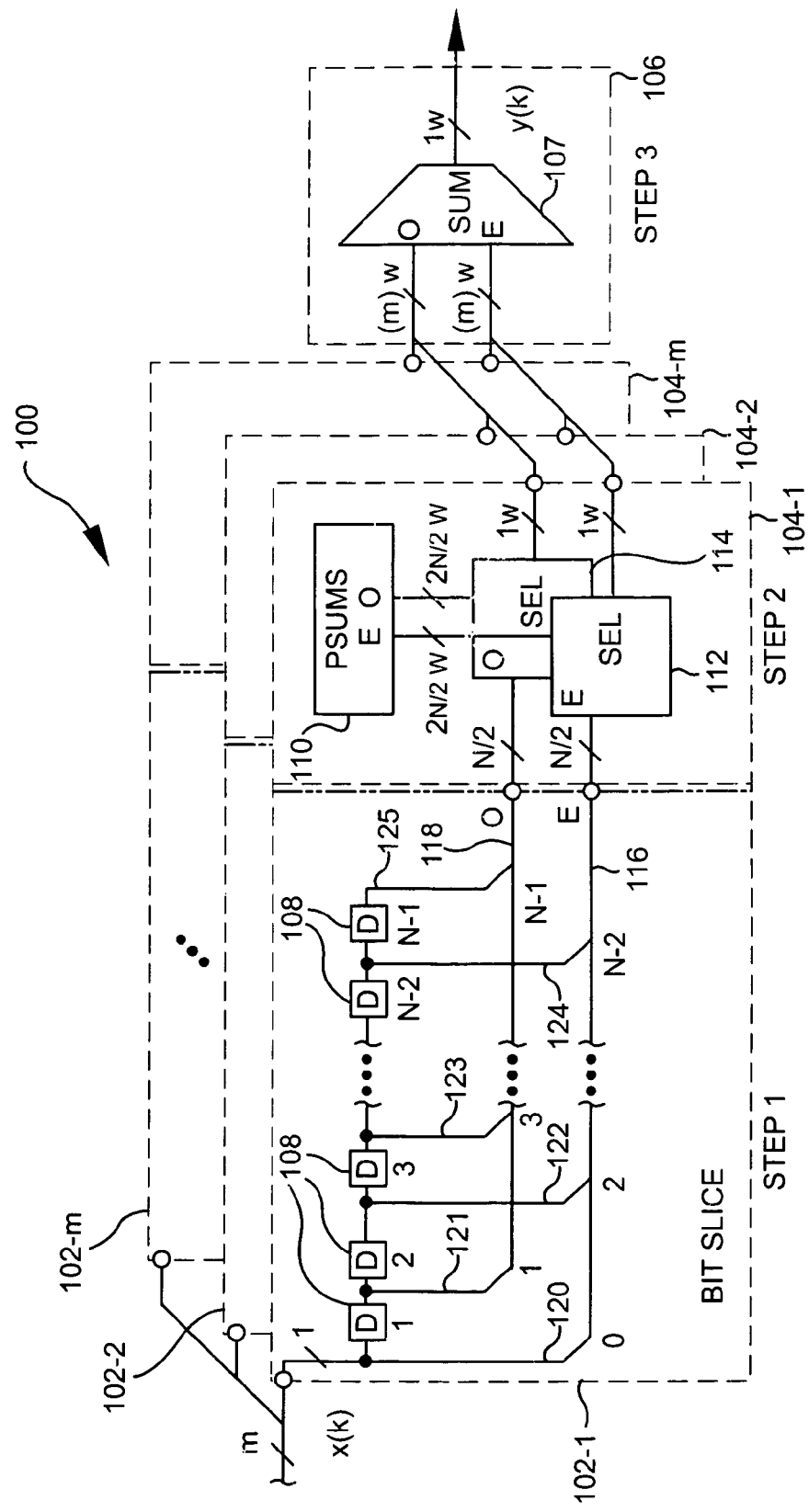
FIG. 1 is a block diagram illustrating a conventional distributed arithmetic (DA) digital finite impulse response (FIR) filter.

FIG. 1 depicts a block diagram of a conventional N-tap DA digital FIR filter 100. The conventional filter 100 receives an m-bit input signal x(k) which is typically processed in parallel bit slices 102-1, 102-2, 102-m, each bit slice corresponding to a particular bit of the input signal x(k). The output y(k) of the conventional filter 100 is calculated from three primary stages or steps operatively coupled in series. A first step (step 1) includes one or more delay generation circuits 102-1, 102-2, 102-m, each delay generation circuit associated with a particular bit slice, a second step (step 2) includes one or more partial sum selection circuits 104-1, 104-2, 104-m, each partial sum selection circuit associated with a bit slice, and a third step (step 3) includes an addition circuit 106.

In the delay generation circuits 102-1 through 102-m (step 1), each individual bit of the m-bit input x(k) is accumulated in one of m (N−1)-stage shift registers. Each shift register essentially includes N−1 delay stages 108 connected in series to form a tapped delay line. Each delay stage 108 has associated therewith a predetermined time delay D such that an output of the delay stage is a delayed version of an input to the delay stage, with each output of a delay stage forming a tap in the delay line, such that the output 125 at stage N−1 is delayed from the input 120 by (N−1)×D. Each successive tap in the delay line is delayed further in time in relation to a previous tap.

In a given delay generation circuit 102-1, the shift register (comprised of delay stages 108) generates two addresses, namely, an even address (E) 116 and an odd address (O) 118. The even address 116 is formed of even output samples or taps 120, 122, 124 of the delay stages 108 and the odd address is formed of odd samples 121, 123, 125 of the delay stages, with each even and odd address 116, 118, respectively, containing N/2 bits. These addresses are used by a corresponding partial sums selection circuit 104-1 which is operatively coupled to the delay generation circuit 102-1 to select, via respective even (E) and odd (O) selection logic SEL 112, 114, precomputed values (referred to as partial sums) from a partial sums table 110. A partial sums table 110 is included which is common for all of the m bit slices and includes $2^N$ entries. The table 110, which may comprise memory or an alternative storage means that is selectively addressable, may be partitioned into two $2^{N-1}$ entry sections corresponding to even and odd partial sums.

In the addition circuit 106 (step 3), the 2 m partial sums selected from the tables 110 are binary weighted (e.g., multiplied by predetermined powers of two) and added together in a SUM block 107 to produce the single-word output sample y(k). In the conventional filter architecture, therefore, step 1 is merely delay generation with no processing function, while steps 2 and 3 are essentially purely functional (i.e., selection of partial sums followed by their addition) and are therefore not time-dependent.

In accordance with the present invention, the conventional DA digital FIR filter is uniquely modified such that one or more delay stages in the conventional delay line are operatively removed and at least a portion of the delay otherwise generated by the removed delay stage(s) is folded or incorporated into at least one of the subsequent function or processing circuitry, such as the partial sum selection circuitry 104-1 through 104-m and/or the addition circuitry 106. The removed delay stage must originate from a signal path having a nonzero delay associated therewith. Otherwise, there would be no idle delay which could be operatively removed. The present invention contemplates that there are various points in the DA digital FIR filter signal path where this technique can be applied, only two of which will be described in detail herein below.

Figure 2:
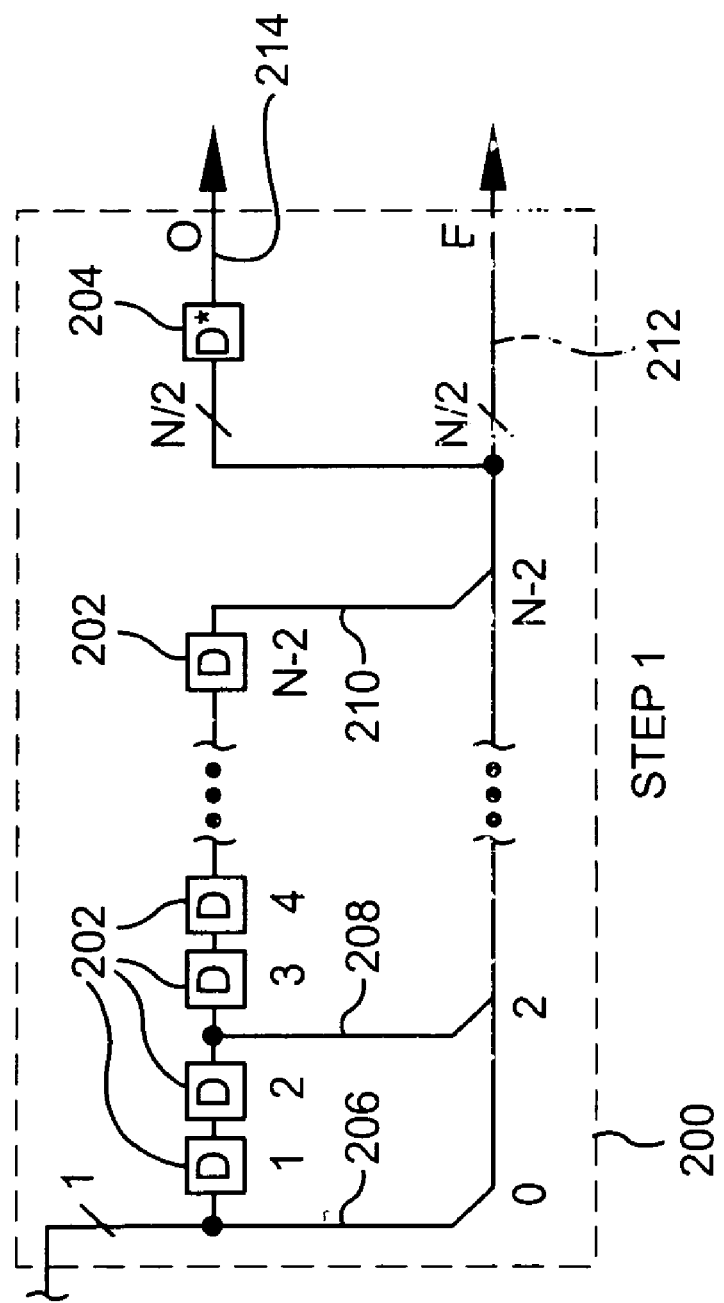
FIG. 2 is a block diagram illustrating an equivalent delay generation architecture employing a one-sample idle delay, formed in accordance with one aspect of the present invention.

With reference now to FIG. 2, an equivalent representation 200 of a delay generation circuit is shown, in accordance with the present invention. The equivalent delay generation circuit includes a plurality of delay stages 202, each having a time delay D associated therewith. The delay stages 202 are preferably coupled together in series such that an output of one delay stage is connected to an input of a succeeding delay stage, thus forming a tapped delay line. The delay stages 202 can be implemented, for example, using flip-flop gates, or an alternative thereof.

One or more individual outputs 208, 210 of the delay stages 202 form taps of the delay line, as understood by those skilled in the art. This equivalent representation 200 of the delay generation circuit exploits the fact that a given set of even samples (e.g., numbered 0, 2, . . . , N−2 in FIG. 1, with sample 0 being the most recent), which forms the even address, becomes a set of odd samples (e.g., numbered 1, 3, . . . , N−1 in FIG. 1), forming the odd address, after one sample cycle. This means that the odd set of samples can be derived from the even set of samples 206, 208, 210 by passing the even set of samples through a foldable one-sample delay stage 204, where D* represents the foldable time delay which is substantially equal to the delay D of a delay stage 202. Thus, the delay line in the equivalent delay generation circuit 200 can be reduced by one delay stage (e.g., to N−2 delay stages), in accordance with the present invention.

The foldable one-sample delay stage 204 can be placed either before or after the partial sums selection circuitry which is coupled to the output of the delay generation circuit 200. As shown in FIG. 2, the one-sample delay stage 204 is placed before the partial sums selection circuitry. An input of the one-sample delay stage 204 is coupled to the set of even samples 206, 208, 210 and an output of the one-sample delay stage forms an odd address 214 which is coupled to the partial sums selection circuitry in a manner consistent with that described herein above. An even address 212 is formed from the even samples 206, 208, 210, as previously described.

It is to be appreciated that the delay generation circuit 200 may include two or more outputs 212, 214, each of the outputs comprising one or more signal paths corresponding to the samples 206, 208, 210. One of the outputs 212 must include a zero delay signal path (e.g., corresponding to sample 206), which essentially has no delay associated therewith. Thus, the remaining signal paths (e.g., corresponding to samples 208, 210) will all have a predetermined nonzero delay associated therewith. When none of the outputs of the delay generation circuit include a zero delay signal path, such zero delay path may be formed, for example, by identifying a nonzero delay signal path having the shortest delay and operatively removing a predetermined amount of delay from all signal paths such that the shortest nonzero delay signal path becomes a zero delay signal path, and the remaining signal paths will all have a nonzero delay associated therewith.

Figure 3:
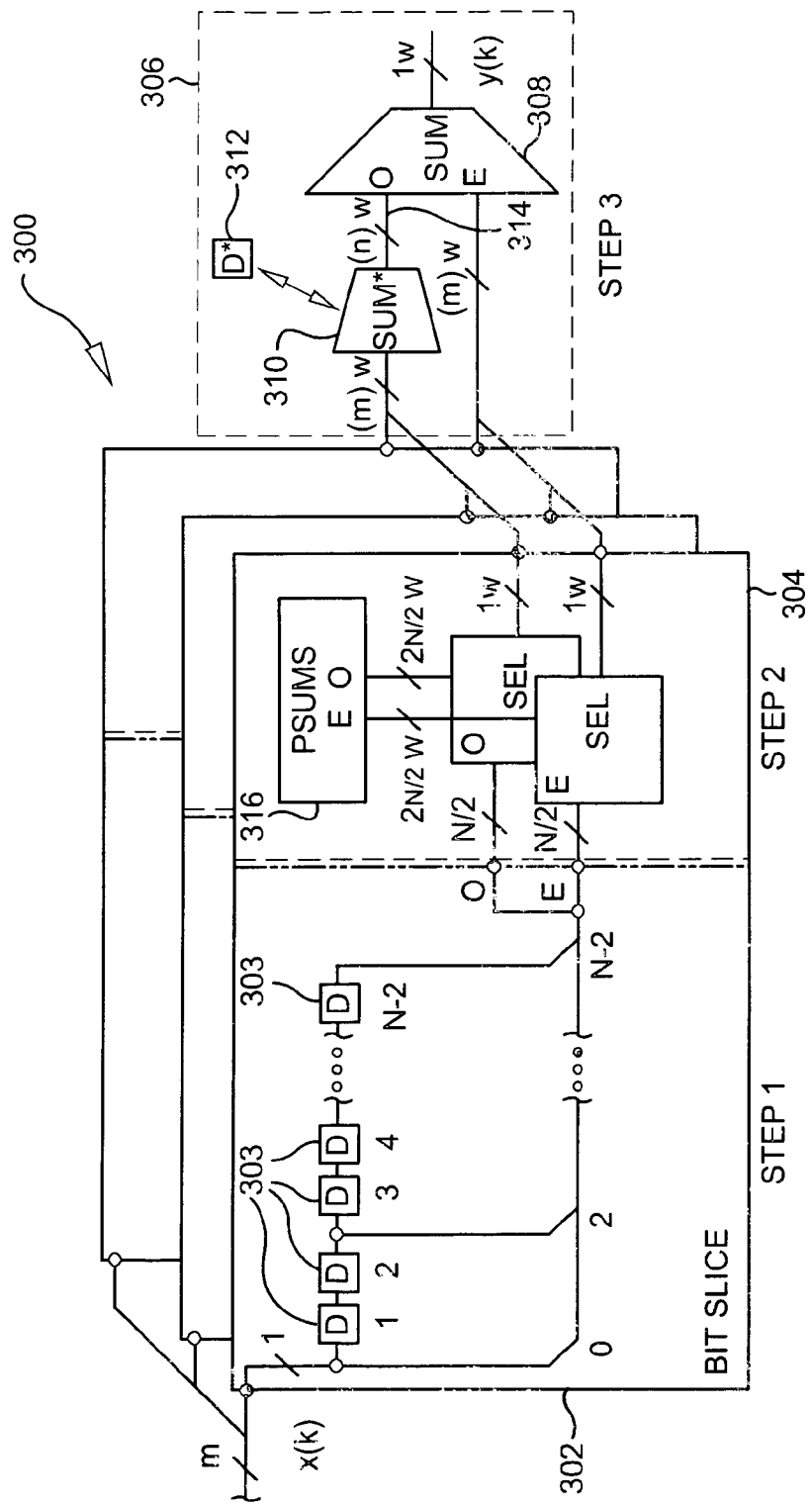
FIG. 3 is a block diagram illustrating a DA digital FIR filter having an idle delay in the odd data subset as shown in FIG. 2, and further including a secondary SUM block in place of the idle delay to remove at least a portion of the computational load from a primary SUM block, formed in accordance with another aspect of the invention.

By way of example only, FIG. 3 illustrates an aspect of the present invention in which, for each bit slice, a foldable one-sample delay stage 312 is placed after the partial sum selection circuitry 304 (step 2) and then folded into the addition circuitry 306 (step 3). As shown in FIG. 3, the DA digital FIR filter 300 comprises m bit slices, each bit slice including a delay generation circuit 302 and a partial sums selection circuit 304 coupled to a corresponding delay generation circuit 302. The delay generation circuit 302 includes an N-2 stage delay line (i.e., comprising N-2 delay stages 303) which may be implemented in a manner consistent with the delay line included in the equivalent delay generation circuit 200 shown in FIG. 2. The partial sums selection circuit 304 may be implemented in a manner consistent with the partial sums selection circuit shown in FIG. 1. It is to be appreciated that one or more functional sub-circuits comprising the partial sums selection circuit 304 (e.g., partial sums table 316, which may be formed in a manner consistent with the partial sums table 110 shown in FIG. 1) and/or the addition circuitry 306 (e.g., SUM block 308) may be operatively shared by two or more bit slices in the DA digital FIR filter 300.

Delay folding in the illustrative embodiment of FIG. 3 takes the form of load redistribution, which is preferably accomplished by replacing the one-sample delay stage 312 with a secondary SUM block 310 coupled in series with odd input path 314 of the addition circuitry 306. The secondary SUM block 310 preferably incorporates a delay associated therewith which is substantially equal to the delay D* of the one-sample delay stage 312. Secondary SUM block 310 preferably removes at least a portion of the computational load of a primary SUM block 308 included in the addition circuitry 306 since it reduces the number of odd partial sums at its input from m to n, where n<m. Consequently, the total number of partial sums (even or odd) to be added is reduced from 2 m to (n+m)<2 m, resulting in a reduction in the overall latency of the addition circuitry 306.

Figure 4:
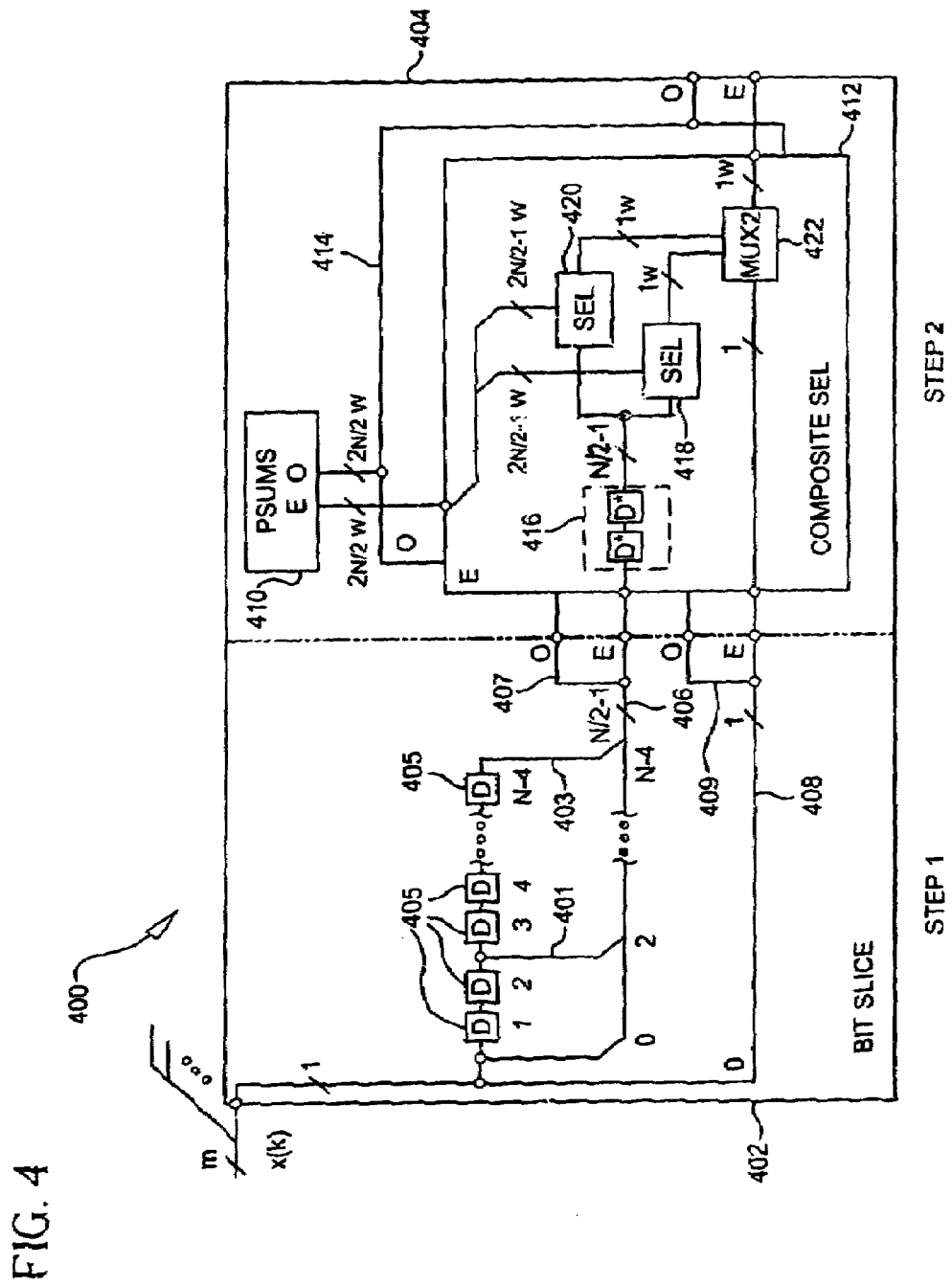
FIG. 4 is a block diagram illustrating a modification of the bit slice architecture of FIG. 3 including a two-sample idle delay in a partial sums address path, in accordance with the present invention.

In another aspect of the invention illustrated in FIG. 4, a full N/2 bit even address derived from even samples 0, 2, ..., N-2, which controls both the even and odd partial sum selection logic (as shown in FIG. 3) is formed essentially from delayed copies of a single data bit. An important corollary of this is that a partial N/2-1 bit address, including samples 2, 4, ..., N-2 (i.e., all bits except the most recent one, bit 0) is known two samples in advance when the partial address is comprised of samples 0, 2, ..., N-4. Knowledge of the partial address in advance allows for further optimization of the partial sums selection procedure, in accordance with the present invention as depicted in FIG. 4.

With reference to the illustrative embodiment of FIG. 4, a portion of a DA digital FIR filter 400 is shown, including a delay generation circuit 402 operatively coupled to a partial sums selection circuit 404 corresponding to a given bit slice of input signal x(k). Delay generation circuit 402 is preferably implemented in a manner consistent with the delay generation circuit of FIG. 3. Specifically, the delay generation circuit 402 includes a plurality of delay stages 405. As previously described, the delay stages 405 are preferably coupled together in series such that an output of one delay stage is coupled to an input of a succeeding delay stage, thus forming a delay line, each delay stage having a delay D associated therewith. One or more predetermined outputs 401, 403 of the delay stages 405 form taps of the delay line. In this embodiment, the N-2 stage delay line shown in FIG. 3 is preferably modified by removing two delay stages, thereby resulting in an N-4 stage delay line. Samples 0, 2, ..., N-4 from the delay line are used to form the partial even address 406 and partial odd address 407 which is coupled to the partial sums selection circuit 404.

Instead of selecting a single partial sum from the partial sums table 410 using a full address, even (E) and odd (O) selection logic 412, 414, respectively, included in the partial sums selection circuit 404 is modified such that two candidate values (partial sums) are preferably pre-selected from the partial sums table 410 based on the partial address 406. Each of these candidate partial sums is stored in a corresponding selection register SEL 418, 420. The selection registers 418, 420 are operatively coupled to a two-to-1 multiplexor (MUX2) 422. Using the remaining late bit 408 (bit 0) of the address, one of the two pre-selected values is chosen to be output to the subsequent addition circuitry (not shown). It is to be appreciated that the odd selection logic 414 may be implemented in a manner consistent with the even selection logic 412, as previously described herein.

Since the partial address is known two samples in advance, this delay, which was removed from the delay line in the delay generation circuit 402 previously described, can be incorporated into the partial sum selection process, enabling completion of the process by the time the last bit of the address arrives. For example, a foldable two-sample delay stage 416 is preferably connected in series between the even partial address 406 and the inputs to the selection registers 418, 420. In this manner, the critical path of the entire bit slice, for example, from the arrival of the last address bit until producing the selected partial sum output, is reduced to a single logic operation, namely, a 2-to-1 multiplexor, which is faster than a conventional one-step $2^{N/2-1}$ selection process, as shown in FIG. 1.

Figure 5:
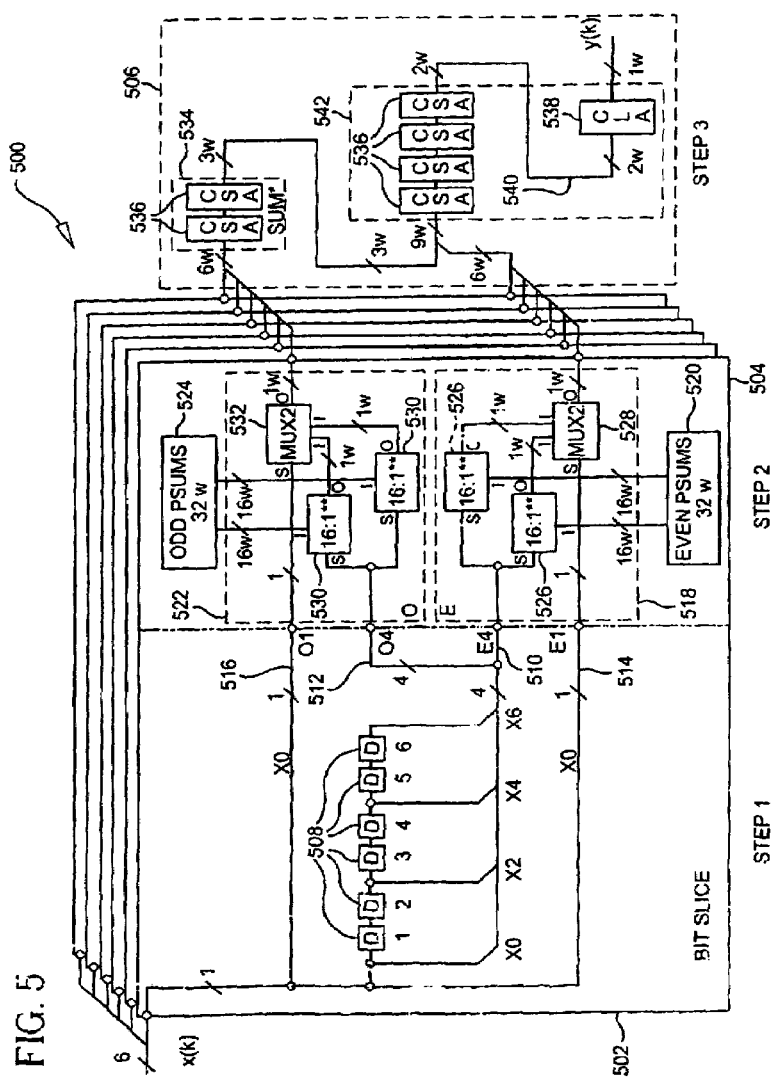
FIG. 5 is a block diagram illustrating an exemplary 10-tap, 6-bit DA digital FIR filter, formed in accordance with the present invention.

By way of example only, FIG. 5 depicts a 10-tap, 6-bit full-rate digital FIR filter architecture 500 employing latency-reduction techniques, formed in accordance with an exemplary embodiment of the present invention corresponding to the case N=10, m=6. With reference to FIG. 5, the filter 500 comprises delay generation circuitry 502 (step 1)

and partial sums selection circuitry 504 (step 2) for each of six (m=6) bit slices, and addition circuitry 506 (step 3) for adding the partial sums obtained from the six bit slices. The delay generation circuitry 502 includes six delay stages 508 connected together in series to form a delay line.

The delay line in the delay generation circuitry 502 is used for generating two five-bit addresses, even and odd, each of which comprise a four-bit partial address (E4) 510, (O4) 512, respectively, and a "last bit" portion (E1) 514, (O1) 516, respectively. In contrast to a conventional implementation of a digital FIR filter (e.g., as depicted in FIG. 1), these addresses have intentionally introduced timing skews. Specifically, the partial addresses 510, 512 are generated two samples early in relation to the remaining last bit portion 514, 516, respectively. The odd address as a whole is generated one more sample early. In order to bring the bits back into proper time alignment, additional compensating delay must be introduced within the partial sums selection circuitry 504 and/or addition circuitry 506. An important advantage of placing the delay in steps 2 and 3, and not within step 1 where such delay originally resided, is that in steps 2 and 3 the delay can be used to perform a signal processing function, while in step 1 the delay is idle, performing no processing function at all, and thus merely adds to the overall latency of the filter, as discussed above.

As previously described, the partial sums selection circuitry 504 includes even selection logic 518 and odd selection logic 522 for addressing partial sums in a corresponding even partial sums table 520 and odd partial sums table 524, respectively. The even selection logic 518 receives both the partial even address 510 and the even last bit portion 514 for accessing the partial sum entries in the even partial sums table 520. Likewise, the odd selection logic 522 receives both the partial odd address 512 and the odd last bit portion 516 for accessing the partial sum entries in the odd partial sums table 524.

Consider first a two-sample skew between the partial address 510 (comprised of "early bits") and the last address bit 514. This skew is compensated within the partial sums selection circuitry 504. The function of each of the selection logic 518, 522 (even and odd, respectively) in the partial sums selection circuitry 504 is to perform a 32-to-1 multiplexor function, namely, selecting one of 32 words stored in a given partial sums table (even 520 or odd 524) using the corresponding 5-bit address. One skilled in the art will recognize that the critical path of a 32:1 multiplexor is significantly large, since it involves decoding of a 5-bit address, delay of selection logic, and wire delays.

In accordance with the present invention, in order to reduce the overall latency of the filter, the 32:1 multiplexor is implemented as a pair of 16:1 multiplexors 528, 530, one pair for the even select logic 518 and the other pair for the odd select logic 522, respectively. Each of the multiplexors 526, 530 includes a 4-bit control input (S) which is connected to and driven by a corresponding partial address 510, 512, respectively. Each of the multiplexors 526, 530 also include an input (I) comprising 16 word lines, each word line connected to a different word in the corresponding partial sums table 520, 524, respectively. The compensating two-sample delay is integrated within the 16:1 multiplexors. The combination of multiplexing and delay functions is represented as 16:1 in FIG. 5**.

An output word line (O) from each of the pair of multiplexors 526, 530 is connected to an input word line (I) of a corresponding 2:1 multiplexor (MUX2) 528, 523 included in the even and odd select logic, respectively. A control input (S) of each of the 2:1 multiplexors 528, 532 in the even and odd select logic 518, 522, respectively, is connected to a corresponding even or odd last bit 514, 516, respectively.

It is to be appreciated that a delay of two samples in the 16:1 multiplexors generally provides sufficient time to complete a 16:1 multiplex operation. Thus, for each of the even and odd select logic 518, 522, the outputs of the pair of 16:1 multiplexors 526, 530 are ready for the subsequent 2:1 multiplexor 528, 532, respectively, by the time the respective last bit 514, 516 arrives. Consequently, the select logic will not significantly affect the critical path of the filter. An important result of the improved filter arrangement thus described is a reduction of the critical path in the partial sums selection circuitry 504** from a 32:1 multiplexor to a 2:1 multiplexor, which can either reduce the overall latency of the filter (most likely by one sample) or otherwise provide a relaxation of timing requirements to the multiplexor logic. In this manner, a filter with higher speed and/or lower power consumption is achieved.

With continued reference to FIG. 5, another improvement to the filter 500 is derived from a one-sample skew between the odd and even addresses, the odd address being delayed in relation to the even address as previously stated. This skew is propagated unchanged through the partial sums selection circuitry 504 and hence is operatively adjusted in the addition circuitry 506. The function of the addition circuitry in filter 500 is to add together a set of 12 partial sums (i.e., 6 even and 6 odd) generated by the partial sums selection circuitry 504 for the six bit slices. In order to compensate for the one-sample skew, odd partial sums must be delayed by one sample. This delay is introduced by a secondary adder block (SUM*) 534, as previously explained in connection with FIG. 2 and FIG. 5, to help lessen the computational load of a primary adder block 542 comprising the addition circuitry 506.

In order to quantify the corresponding improvement in filter latency, consider a typical hardware implementation of the addition circuitry 506. One conventional structure used for addition of multiple numbers is a carry-save adder (CSA) 536. The addition circuitry 506 operatively utilizes a plurality of CSA blocks 536, forming a CSA tree, followed by a carry-lookahead adder (CLA) 538. The purpose of the CSA tree is to convert (e.g., compress) multiple numbers into just two output numbers 540. These two output numbers 540 are then added together in a final addition performed by the CLA 538 to generate a single output y(k) of the filter 500.

A CSA tree preferably includes several levels (layers) of single-bit CSA logic gates 536, as shown, with each layer being capable of compressing three input numbers into two numbers. The CSA tree, however, cannot be used to compress two numbers into one, hence the need for a final CLA 538. For example, it takes two CSA layers to compress six odd partial sums into three (e.g., 6 to 4 to 3), and the primary adder block 542 will be required to add only 9 numbers instead of 12, as would otherwise be required without the secondary adder block 534. A CSA tree for 12 numbers requires five layers of CSA blocks 536 (e.g., 12 to 8 to 6 to 4 to 3 to 2), while a CSA tree for 9 numbers requires only four layers of CSA blocks 536 (e.g., 9 to 6 to 4 to 3 to 2). Depending on the implementation of the addition circuitry, this reduction of one CSA layer in the primary adder either yields an overall filter latency reduction (e.g., by one sample), or a considerable relaxation of timing requirements to the adder blocks. In this manner, a filter with higher speed and/or lower power consumption is achieved.

In summary, in the illustrative case of a 6-bit, 10-tap digital FIR filter thus shown, two techniques of the present invention, namely, pre-skewing the odd address in relation to the even address by one sample and pre-skewing the early bits of the address, both even and odd, in relation to the last bit by two-samples, yield a significant reduction of the filter critical path as follows: (i) a 5-layer CSA tree is replaced with a 4-layer CSA tree (first technique); and (ii) a 32:1 multiplexor is replaced with a 2:1 multiplexor (second technique). Each of these improvements can reduce filter latency by one sample and/or relax timing requirements to the filter circuitry, thus enabling operation with higher speed and/or power, as previously explained.

Figure 6:
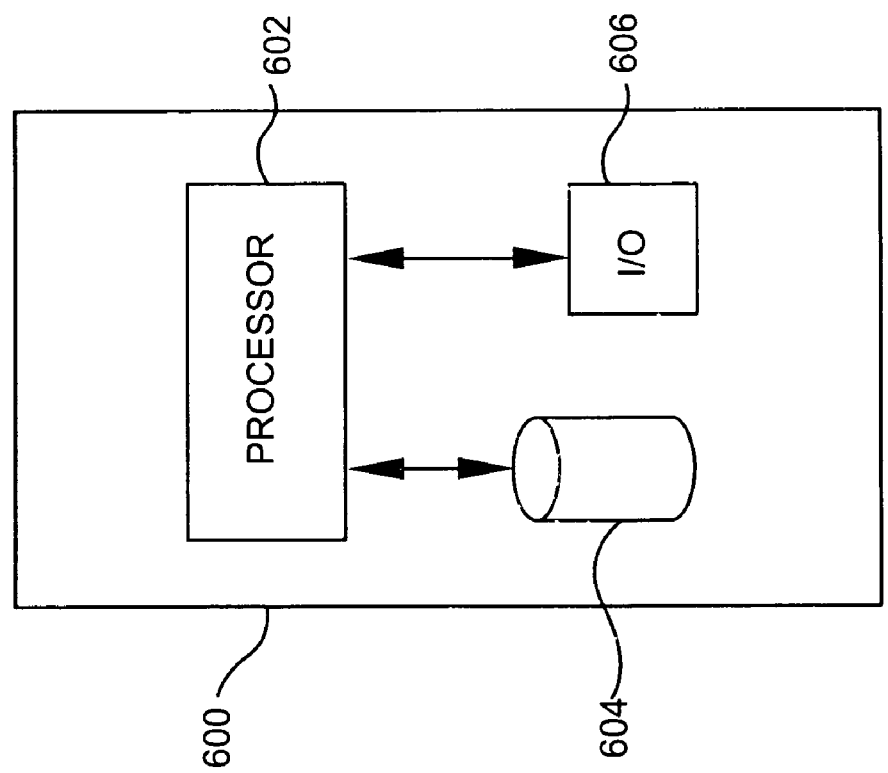
FIG. 6 is a block diagram illustrating a generalized computer system architecture for implementing at least some of the methodologies of the present invention.

Referring now to FIG. 6, a block diagram is shown illustrating a generalized hardware architecture of a computer system 600 suitable for implementing the various functional components of a DA digital FIR filter as depicted in the figures and explained in detail herein. It is to be appreciated that some or all of the digital signal processing methodologies of the present invention described herein are capable of being implemented as a software program or routine operating on data stored, for example, in computer memory included in the computer system or can be implemented with dedicated hardware, as understood by those skilled in the art.

The software program or routine may be distributed in the form of computer readable media, and that the present invention applies equally regardless of the particular type of signal-bearing media actually used to carry out the distribution. The term "computer readable media" as used herein is intended to include recordable-type media, such as, for example, a floppy disk, a hard disk drive, random access memory (RAM), compact disk (CD) read only memory (ROM), digital video disk (DVD) ROM, etc., and transmission-type media, such as digital and analog communication links, wired or wireless communication links using transmission forms, such as, for example, radio frequency and optical transmissions, etc. The computer readable media may also take the form of coded formats that are decoded for use in a particular data processing system.

As shown in FIG. 6, the computer system 600 may be implemented in accordance with a processor 602, a memory 604 and input/output (I/O) devices 606. It is to be appreciated that the term "processor" as used herein is intended to include any processing device, such as, for example, one that includes a central processing unit (CPU) and/or other processing circuitry (e.g., digital signal processor (DSP), microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O devices" as used herein is intended to include, for example, one or more input devices (e.g., keyboard, mouse, etc.) for entering data (e.g., predetermined filter coefficients) to the processor, and/or one or more output devices (e.g., CRT, printer, monitor, etc.) for presenting the results associated with the processor. It is contemplated that the digital signal processing system of the present invention may be implemented in an integrated circuit (IC) device.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A digital signal processing device for processing an input signal, the digital signal processing device comprising:
   delay generation circuitry, the delay generation circuitry including an input for receiving the input signal and a plurality of delay stages operatively coupled together, each of the delay stages having a predetermined time delay associated therewith, the delay generation circuitry including a zero delay signal path and at least one nonzero delay signal path associated therewith; and
   processing circuitry coupled to the delay generation circuitry, the processing circuitry being operatively configured to: (i) define a first subset of signal paths through the delay generation circuitry, the first subset including the zero delay signal path, and at least a second subset of signal paths through the delay generation circuitry, the second subset including one or more nonzero delay signal paths; (ii) remove an idle delay from all signal paths in the second subset, such that a shortest nonzero delay signal path in the second subset becomes a zero delay signal path; and (iii) incorporate the idle delay with the processing circuitry.

2. The device of claim 1, wherein at least a portion of the idle delay is incorporated into the processing circuitry by selectively increasing a computational workload in one or more signal paths associated with the second subset and selectively reducing a computational workload in one or more signal paths associated with the first subset, such that a difference between computational latencies associated with the respective first and second subsets is substantially equal to the idle delay.

3. The device of claim 1, wherein the digital signal processing device is configured as a distributed arithmetic digital finite impulse response (FIR) filter.

4. The device of claim 1, wherein at least a portion of the plurality of delay stages associated with the delay generation circuitry are operatively coupled together in a series configuration to form a tapped delay line, an output of each of the delay stages forming a respective tap in the delay line.

5. The device of claim 1, wherein the processing circuitry comprises:
   lookup table circuitry operatively coupled to the delay generation circuitry, the lookup table circuitry being configured to receive an address generated by the delay generation circuitry for selectively accessing one or a plurality of precomputed values stored in the lookup table circuitry; and
   subsequent processing circuitry coupled to the lookup table circuitry.

6. The device of claim 5, wherein the address generated by the delay generation circuitry includes a first address portion associated with the second subset in which the idle delay has been removed, and at least a second address portion associated with the first subset, the second address portion being skewed with respect to the first address portion by a predetermined amount of time, the predetermined amount of time being substantially equal to the idle delay removed from the second subset.

7. The device of claim 6, further comprising:
   a plurality of preselection registers, the preselection registers receiving the first address portion and at least temporarily storing a plurality of candidate precomputed values in response thereto, the plurality of candidate precomputed values corresponding to possible precomputed values from the lookup table circuitry corresponding to the second address portion, the second address portion being used to select at least one candidate precomputed value from one or more of the preselection registers.

8. The device of claim 7, further comprising:
a multiplexer coupled to the preselection registers, the multiplexer receiving the second address portion and operatively selecting the at least one candidate partial sum in response thereto.

9. In a digital signal processing device including delay generation circuitry and processing circuitry coupled to the delay generation circuitry, a method for processing an input signal presented to the digital signal processing device, the method comprising the steps of:
identifying a first subset of signal paths through the delay generation circuitry, the first subset of signal paths including a zero delay signal path;
identifying at least a second subset of signal paths through the delay generation circuitry, the second subset of signal paths including one or more nonzero delay signal paths;
operatively removing an idle delay from all signal paths in the second subset, such that a shortest nonzero delay signal path in the second subset becomes a zero delay signal path; and
incorporating the idle delay with the processing circuitry.

10. The method of claim 9, wherein the step of operatively removing the idle delay from all signal paths in the second subset comprises:
selectively increasing a computational workload in one or more signal paths associated with the second subset; and
selectively reducing a computational workload in one or more signal paths associated with the first subset;
whereby a difference between computational latencies associated with the respective first and second subsets is substantially equal to the idle delay.

11. The method of claim 9, further comprising the steps of:
for a given subset:
(i) identifying a first nested subset of signal paths through the delay generation circuitry, the first nested subset of signal paths including a zero delay signal path; and
(ii) identifying at least a second nested subset of signal paths through the delay generation circuitry, the second nested subset of signal paths including one or more nonzero delay signal paths; and
redistributing a computational workload among two or more signal paths associated with the at least second nested subset by selectively increasing a computational workload in one or more signal paths associated with the second nested subset and selectively reducing a computational workload in one or more signal paths associated with the first nested subset, such that a difference between computational latencies associated with the respective first and second nested subsets is substantially equal to a second idle delay associated with the second nested subset.

12. The method of claim 9, further comprising the step of:
storing a plurality of precomputed values corresponding to the processing circuitry, each of the precomputed values being selectively accessed by a unique address associated therewith, the address being generated by the delay generation circuitry.

13. The method of claim 12, further comprising the step of:
partitioning the address generated by the delay generation circuitry into a first address portion and at least a second address portion, the second address portion being skewed with respect to the first address portion by a predetermined amount of time.

14. The method of claim 13, further comprising the step of:
preselecting two or more precomputed values corresponding to the first address portion; and
selecting at least one precomputed value of the two or more precomputed values, the at least precomputed value corresponding to the second address portion.

15. The method of claim 14, wherein the step of preselecting two or more precomputed values comprises the step of:
receiving the first address portion and at least temporarily storing a plurality of candidate partial sums in response thereto, the plurality of candidate partial sums corresponding to possible values of the second address portion, the second address portion being used to select at least one candidate partial sum.

16. Apparatus for processing an input signal, the apparatus comprising:
a memory, the memory being capable of storing one or more delayed samples of the input signal; and
at least one processor coupled to the memory, the at least one processor being operative to: (i) identify a first subset of signal paths through the memory, the first subset of signal paths including a zero delay signal path; (ii) identify at least a second subset of signal paths through the memory, the second subset of signal paths including one or more nonzero delay signal paths; (iii) operatively remove an idle delay from all signal paths in the second subset, such that a shortest nonzero delay signal path in the second subset becomes a zero delay signal path; and (iv) merge the idle delay into the at least one processor.

17. The apparatus of claim 16, wherein the step of operatively removing the idle delay from all signal paths in the second subset comprises selectively increasing a computational workload in one or more signal paths associated with the second subset and selectively reducing a computational workload in one or more signal paths associated with the first subset, such that a difference between computational latencies associated with the first and second subsets is substantially equal to the idle delay.

18. An integrated circuit (IC) device, the IC device including at least one digital signal processing device for processing an input signal, the at least one digital signal processing device comprising:
delay generation circuitry, the delay generation circuitry including an input for receiving the input signal and a plurality of delay stages operatively coupled together, each of the delay stages having a predetermined time delay associated therewith, the delay generation circuitry including a zero delay signal path and at least one nonzero delay signal path associated therewith; and
processing circuitry coupled to the delay generation circuitry, the processing circuitry being operatively configured to: (i) define a first subset of signal paths through the delay generation circuitry, the first subset including the zero delay signal path, and at least a second subset of signal paths through the delay generation circuitry, the second subset including one or more nonzero delay signal paths; (ii) remove an idle delay from all signal paths in the second subset, such that a shortest nonzero delay signal path in the second subset becomes a zero delay signal path; and (iii) incorporate the idle delay with the processing circuitry.

19. The IC device of claim 18, wherein at least a portion of the idle delay associated with the at least one digital signal processing device is incorporated into the processing circuitry of the at least one digital signal processing device by selectively increasing a computational workload in one or more signal paths associated with the second subset and selectively reducing a computational workload in one or more signal paths associated with the first subset, such that a difference between computational latencies associated with the respective first and second subsets is substantially equal to the idle delay.

20. The IC device of claim 18, wherein at least one digital signal processing device is configured as a distributed arithmetic digital finite impulse response (FIR) filter.

* * * * *